(12) United States Patent
Lim et al.

(10) Patent No.: US 10,083,922 B2
(45) Date of Patent: Sep. 25, 2018

(54) INDUCTOR INTERCONNECT

(71) Applicant: Intel Corporation, Santa Clara, CA (US)

(72) Inventors: Min Suet Lim, Simpang Ampat (MY); Chin Lee Kuan, Bayan Lepas (MY); Eng Huat Goh, Penang (MY); Khang Choong Yong, Puchong (MY); Bok Eng Cheah, Bukit Gambir (MY); Jackson Chung Peng Kong, Tanjung Tokong (MY); Howe Yin Loo, Sungai Petani (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/359,926

(22) Filed: Nov. 23, 2016

(65) Prior Publication Data

US 2018/0145042 A1 May 24, 2018

(51) Int. Cl.
| | |
|---|---|
| *H01L 23/48* | (2006.01) |
| *H01L 23/52* | (2006.01) |
| *H01L 29/40* | (2006.01) |
| *H01L 23/64* | (2006.01) |
| *H01L 23/498* | (2006.01) |
| *H01L 21/48* | (2006.01) |

(Continued)

(52) U.S. Cl.
CPC ........ *H01L 23/645* (2013.01); *H01L 21/4853* (2013.01); *H01L 21/56* (2013.01); *H01L 23/3157* (2013.01); *H01L 23/49811* (2013.01); *H01L 23/49816* (2013.01);

(58) Field of Classification Search
CPC ......... H01L 23/49822; H01L 21/76898; H01L 2224/75204; H01L 2224/73253; H01L 23/5227; H01L 28/10; H01L 23/645
USPC ....... 257/528, 686, 777, 726, 727, 712, 714, 257/786; 438/106, 107, 108, 109, 117, 438/119
See application file for complete search history.

(56) References Cited

U.S. PATENT DOCUMENTS

| | | | |
|---|---|---|---|
| 6,445,271 B1 * | 9/2002 | Johnson | H01F 17/0033 257/531 |
| 6,707,680 B2 * | 3/2004 | Schaper | H05K 1/023 174/524 |

(Continued)

FOREIGN PATENT DOCUMENTS

WO  WO-2008099327 A2  8/2008

OTHER PUBLICATIONS

"International Application Serial No. PCT/US2017/058319, International Search Report dated Feb. 7, 2018", 8 pgs.

(Continued)

*Primary Examiner* — S. V. Clark
(74) *Attorney, Agent, or Firm* — Schwegman Lundberg & Woessner, P.A.

(57) ABSTRACT

A device and method of utilizing spiral interconnects for voltage and power regulation are shown. Examples of spiral interconnects include air core inductors. An integrated circuit package attached to a motherboard using spiral interconnects is shown. Methods of attaching an integrated circuit package to a motherboard using spiral interconnects are shown including air core inductors. Methods of attaching spiral interconnects include using electrically conductive adhesive or solder.

22 Claims, 4 Drawing Sheets

(51) Int. Cl.
*H01L 21/56* (2006.01)
*H01L 23/31* (2006.01)

(56) References Cited

U.S. PATENT DOCUMENTS

| | | | | |
|---|---|---|---|---|
| 7,378,733 | B1* | 5/2008 | Hoang | H01L 23/50 |
| | | | | 257/724 |
| 8,274,144 | B2* | 9/2012 | Ro | H01L 23/49811 |
| | | | | 257/686 |
| 8,436,491 | B2* | 5/2013 | Walley | G06K 7/10207 |
| | | | | 307/104 |
| 2002/0056922 | A1* | 5/2002 | Funaya | H01L 23/49811 |
| | | | | 257/778 |
| 2002/0117330 | A1 | 8/2002 | Eldridge et al. | |
| 2003/0214028 | A1* | 11/2003 | Brechignac | H01L 31/0203 |
| | | | | 257/706 |
| 2006/0022336 | A1* | 2/2006 | Franzon | H01L 23/13 |
| | | | | 257/734 |
| 2009/0085155 | A1* | 4/2009 | Bailey | G06F 17/5036 |
| | | | | 257/531 |
| 2011/0068433 | A1* | 3/2011 | Kim | H01L 23/552 |
| | | | | 257/531 |
| 2011/0215863 | A1* | 9/2011 | Pan | H01L 23/642 |
| | | | | 327/564 |
| 2014/0217546 | A1 | 8/2014 | Yen et al. | |
| 2015/0137932 | A1* | 5/2015 | Chen | H01L 28/10 |
| | | | | 336/212 |
| 2015/0302974 | A1* | 10/2015 | Zhao | H01F 17/0013 |
| | | | | 361/270 |
| 2016/0295698 | A1 | 10/2016 | Jeong | |

OTHER PUBLICATIONS

"International Application Serial No. PCT/US2017/058319, Written Opinion dated Feb. 7, 2018", 7 pgs.

* cited by examiner

INDUCTOR INTERCONNECT

TECHNICAL FIELD

Embodiments described herein generally relate to electrical interconnections for microelectronic devices.

BACKGROUND

Microelectronic devices such as IC (integrated circuit) packages utilize interconnects to attach the microelectronic devices to a circuit board. A surface-mount type interconnect is often used between a microelectronic device and a motherboard due to the ability to fit more connections in a smaller space. Microelectronic devices may require circuitry for voltage regulation and power delivery between the IC and the circuit board it is ultimately connected to.

DESCRIPTION OF EMBODIMENTS

Figure 1:
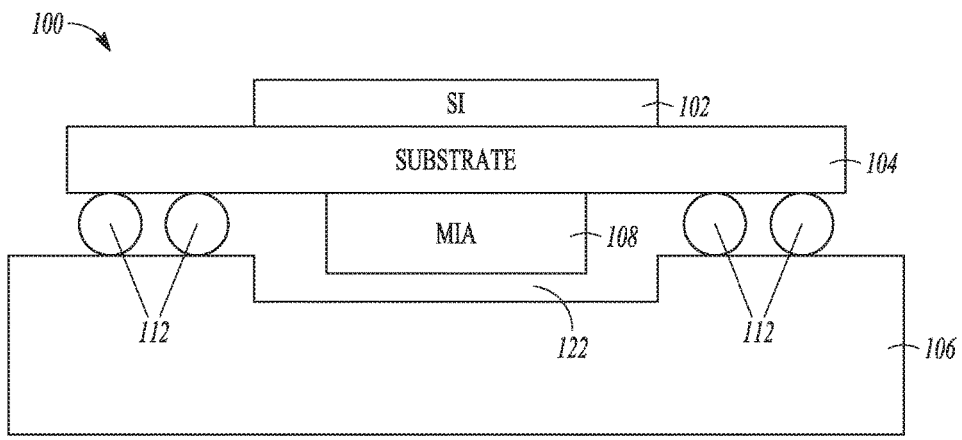
FIG. 1 is a cross-sectional view of an IC package utilizing an MIA (magnetic inductor array).

FIG. 1 shows a cross-sectional view 100 of an IC package attached to a motherboard 106. The IC package shown utilizes an MIA (magnetic inductor array) 108 for IC package voltage regulation. The IC package includes a silicon die 102 attached to a top side of a substrate 104, and the MIA 108 attached to a bottom side of the substrate 104. Some examples may include an LC filter package attached to the bottom side of the substrate 104 in tandem with the MIA 108. The various components may be attached with solder, epoxy, or using other electrically conductive materials. The bottom interconnect portion of the substrate 104 may include a BGA (ball grid array). The substrate 104 is attached to a motherboard 106, typically using solder balls 112. The motherboard 106 may be a circuit board, a PCB (printed circuit board), interposer, or other board designed for multiple components. A recess 122 in the motherboard 106 is needed to accommodate the height of the MIA 108.

The inclusion of an MIA 108 in IC packages may require a recess 122 in the motherboard 106 to accommodate the height of the MIA 108. A recess 122 adds a significant cost to the motherboard 106 and impacts trace routing. In some examples, the inclusion of an MIA may require a hole that passes completely through the motherboard 106. Situations requiring a hole completely through the motherboard 106 have even larger impacts than those only requiring a recess 122. A hole completely through the motherboard 106 introduces EMI concerns to the package and does not allow for a double sided PCB design. A hole completely through the motherboard 106 removes an entire area of the motherboard 106 normally used for trace routing and weakens the strength of the motherboard 106.

In some examples an ACI FIVR (air core inductor as fully integrated voltage source) can be used as an alternative to an MIA 108. An ACI FIVR places the voltage regulation hardware and power regulating LC filters directly into the substrate. While an ACI FIVR does not require a recess or a hole in the motherboard 106, other drawbacks take its place. An ACI FIVR requires area free of interconnects on the bottom side of the substrate 104 within the region beneath the silicon die referred to as the silicon die shadow region. This limits the space available for interconnects on the bottom side of the substrate 104 and the space available for trace routing within the substrate 104. Because inductance of air core inductors is affected by size and shape, the inductance of the air core inductors in the ACI FIVR becomes limited by the volume of the substrate 104 in the silicon die shadow region. Similarly, the ability to tune the number of turns of the air core inductors in order to tune the inductance of the air core inductor is limited by the number of layers in the substrate 104. Air core inductors by design include a region void of metal. This decreases the metal density in the portion of the substrate 104 located within the silicon die shadow region.

Using examples that include an MIA or an ACI FIVR for voltage regulation in IC packages have significant drawbacks. Further, these drawbacks that get significantly worse as the size of IC packages get smaller. A solution that avoids the drawbacks of the MIA and ACI FIVR examples and scales well with increasingly smaller IC packages is desired.

Figure 2:
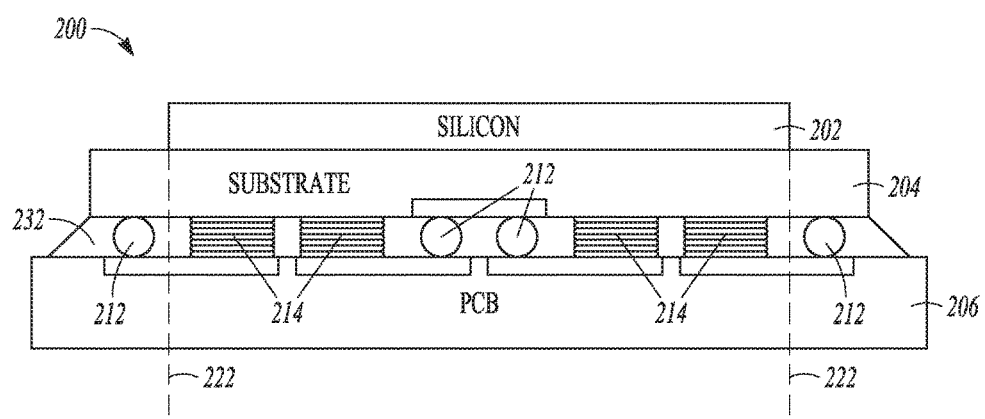
FIG. 2 is a cross section view of an IC package in accordance with some embodiments of the invention.

FIG. 2 shows a cross-sectional representation 200 of an IC package attached to a motherboard through a plurality of interconnects. The IC package includes a silicon die 202 mounted in "flip-chip" orientation with its active side facing downward to couple with an upper surface of a substrate 204. In embodiments where the silicon die is a processor die the IC package can be termed a processor assembly. In some examples, the silicon die 202 may be a digital signal processor, a graphics processing unit, a microcontroller, or any other integrated circuit. In some examples the substrate 204 includes a BGA for connecting to a motherboard 206.

Shown are a number of interconnections, including solder balls 212 and electrically conductive spiral interconnects 214. These connect the lower surface of the substrate 204 to additional packaging such as a motherboard 206. In some examples, the motherboard 206 may be a circuit board, a PCB (printed circuit board), an interposer, or other hoard designed for multiple components. Also shown is the boundary 222 of the silicon die shadow region. The silicon die shadow region is the space below the area covered by the silicon die 202. In some examples, the spiral interconnects 214 are located within the silicon die shadow region. Also shown is a dielectric 232 between the substrate 204 and the motherboard 206, encapsulating the various interconnects including solder balls 212 and spiral interconnects 214.

In some examples, the spiral interconnects 214 serve as voltage regulators and may also fill the role of LC filters. This frees up the space in the substrate 204 located in the silicon die shadow region, and removes the need for a recess or hole in the motherboard 206. By doing this, the negative impacts of the MIA and ACI FIVR are avoided when using spiral interconnects 214. The full area of both the motherboard 206 and the substrate 204 located within silicon die shadow region is available for trace routing. This reduces cost, EMI concerns, metal density concerns, and space impacts. The space in the silicon die shadow region can also be used for interconnections besides the spiral interconnects 214. As shown, in some examples, solder balls 212 are located in the silicon die shadow region along with spiral interconnects 214. The characteristics of the spiral interconnects 214 can be chosen to achieve a desired inductance, quality factor, and size including height, and diameter.

In some examples, the spiral interconnects 214 are air core inductors. An air core inductor is an inductive electrical structure that is not wrapped around a ferromagnetic core. An air core inductor may be wrapped around a core composed of plastic, ceramic, epoxy, or other non-ferromagnetic forms. An air core inductor may also lack a core of any material and have air inside the windings. The air core inductors 214 may be chosen based upon a desired inductance, quality factor, resistance, and size. Inductance and resistance, characteristics which dominate the quality factor, of air core inductors may be adjusted by changing the number of turns, the void size, and diameter of the air core inductors 214. Adjusting the pad size at the substrate 204 or the motherboard 206 may be done to further optimize the performance of the air core inductors 214. Several of the air core inductors 214 may be attached in an electrically parallel configuration for an effectively low resistance and to cope with interconnect max current requirements.

Air core inductor efficiency has a strong dependence on quality factor. An air core inductor with a good quality factor has high inductance and low AC (alternating current) resistance. Quality factor of air core inductors is given by the following equations:

$$Q = \frac{\omega L}{R}$$
$$L \propto N^2 \times r^2$$

Where Q is the quality factor, $\omega$ is the resonant frequency, L is the inductance, R is the AC resistance, N is the number of turns, and r is the radius of the air core inductor.

In some examples, the spiral interconnects 214 are ferromagnetic core inductors. Ferromagnetic inductors are wound or formed around a ferromagnetic material. This can significantly increase the inductance due to the increased magnetic permeability of the core in a ferromagnetic core inductor. However, a ferromagnetic core can introduce core losses and nonlinearity to the inductor, which are undesirable. Core losses occur when eddy currents form in the ferromagnetic core, resulting in energy loss. Core losses also include hysteresis losses in which a reversing magnetic field causes energy loss due to the motion of the tiny magnetic domains within the ferromagnetic core. Nonlinearity is introduced when the magnetic core saturates. When this occurs the inductance changes with the current through the inductor. In some examples, the ferromagnetic core inductors are laminated core inductors. In laminated core inductors the stacks of thin metal sheets are layered with an insulating coating in between. This prevents eddy currents from occurring between the sheets and the resulting eddy currents are very small, limiting the core loss due to eddy currents.

In some examples, the space between the substrate 204 and the motherboard 206 is filled with a dielectric 232. This dielectric 232 may be supplemented with magnetic material to further enhance the inductance of the spiral interconnects 214. In some examples, the dielectric 232 contains suspended particles. In some examples the suspended particles are metallic. In some examples the suspended particles are magnetic. In some examples, the dielectric 232 is a flowable encapsulant. In some examples, the dielectric 232 is an epoxy. In some examples, the dielectric is a mold material. The previous examples including a dielectric in various forms allow further control and enhancement of the inductance of the spiral interconnects 214.

In some examples, the lower surface of the substrate 204 is a BGA (ball grid array). The spiral interconnects 214 are attached to the solder balls 212 of the BGA to form an electrical connection, allowing the use of spiral interconnects without requiring special structures or change in substrate design to accommodate the spiral interconnects 214. Solder balls are attached to second end of the spiral interconnects 214 where they connect to the motherboard 206.

In some examples, the spiral interconnects 214 are attached to the substrate 204 using an electrically conductive adhesive. The spiral interconnects 214 may also be connected to the motherboard 206 using an electrically conductive adhesive. In some examples the conductive adhesive is a conductive epoxy. This may allow for further control of the electrical properties of the spiral interconnects 214 to achieve the desired properties and performance.

In some examples, the pad size of the substrate 204 or the motherboard 206 are adjusted to further optimize the performance of the spiral interconnects 214. In some examples, several of the spiral interconnects 214 are attached in an electrically parallel configuration for an effectively low resistance and to cope with interconnect max current requirements.

Figure 3:
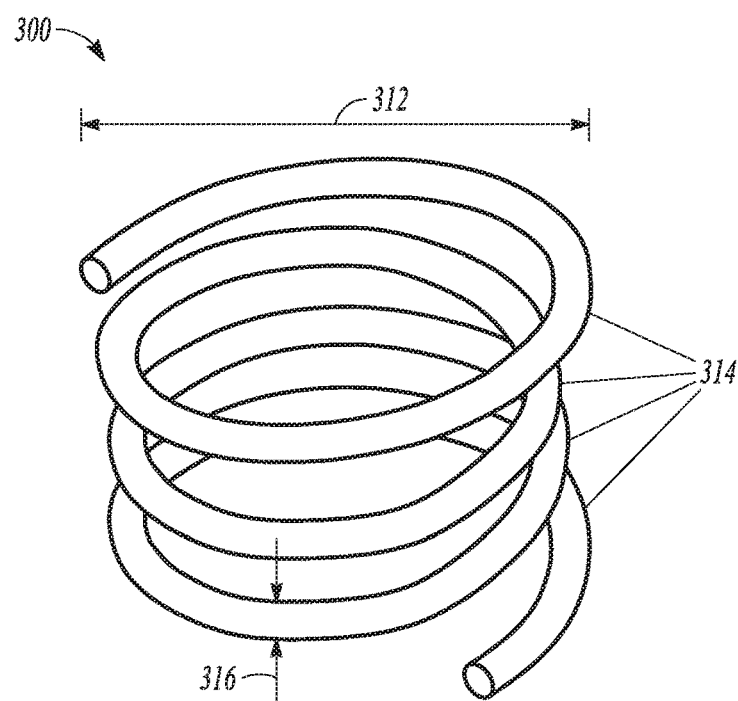
FIG. 3 is an example of a spiral interconnect.

FIG. 3 shows one example of a spiral interconnect. In FIG. 3 the spiral interconnect 300 maintains a coil diameter equivalent to the end diameter 312. In some examples, the end diameter 312 is larger to accommodate a larger pad size. In some examples, the end diameter 312 is smaller to accommodate a smaller pad size. In some examples, the coil diameter can vary from the end diameter 312, getting smaller or larger depending on the desired characteristics. Shown are four turns 314 in the spiral interconnect 300. In some examples, there are more than four turns 314 in the spiral interconnect 300. In some examples, there are fewer than four turns 314 in the spiral interconnect 300. The number of turns in the spiral interconnect 300 can be adjusted to achieve a desired inductance of the spiral interconnect 300. Shown is a spiral interconnect diameter 316. The spiral interconnect diameter 316 can be adjusted to achieve a desired resistance.

In some examples, the spiral interconnect 300 is an air core inductor. In some examples, the void of the spiral interconnect 300 is filled with plastic, ceramic, epoxy, or other non-ferromagnetic material. In some examples, the spiral interconnect 300 is a ferromagnetic inductor. In some examples, the spiral interconnect is composed of copper, aluminum, or other conductive metal. In some examples, the spiral interconnect 300 is coated in plastic, ceramic, epoxy, or other non-conductive material.

The characteristics of the spiral interconnect 300 including the coil diameter, the end diameter 312, the number of turns 314, the spiral interconnect diameter 316, the spiral interconnect material, the void size, the material composition, and the material filling the void, can all be chosen or adjusted to achieve a desired inductance and quality factor. This allows the spiral interconnect 300 to be chosen or adjusted based upon the needs and constraints of the semiconductor device the spiral interconnect 300 is a part of.

In some examples, the characteristics of each spiral interconnect of a semiconductor device are chosen based upon the needs of the connection the spiral interconnect is used for. In some examples, at least some of the spiral interconnects have the same characteristics. In some examples, at least some of the spiral interconnects have different characteristics.

Figure 4:
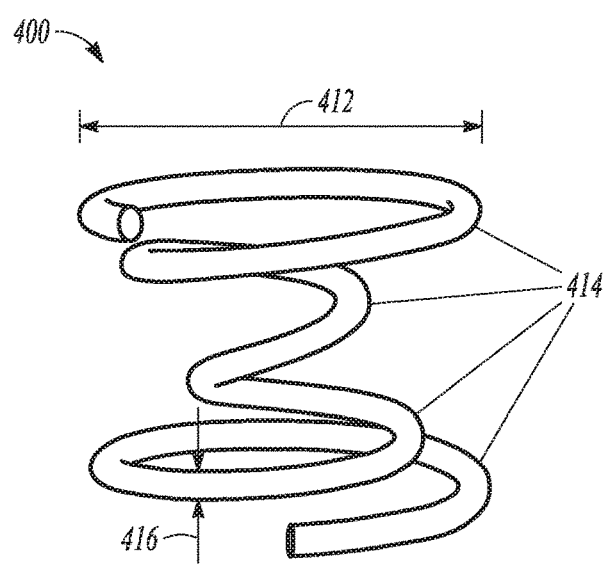
FIG. 4 is a second example of a spiral interconnect.

FIG. 4 shows one example of a spiral interconnect. In FIG. 4 the spiral interconnect 400 has a tapered coil diameter. The end diameter 412 of the spiral interconnect is where the coil diameter is the largest and the middle of the spiral interconnect is where the coil diameter is the smallest. In some examples, the smallest coil diameter is located towards one end. In some examples, the coil diameter tapers in before maintaining a constant diameter for at least a portion of the length of the spiral interconnect 400. In some examples, the coil diameter in the middle is larger than the end diameter 412.

In some examples, the end diameter 412 is larger to accommodate a larger pad size. In some examples, the end diameter 412 is smaller to accommodate a smaller pad size. In some examples, the coil diameter can vary from the end diameter 412, getting smaller or larger depending on the desired characteristics. Shown are four turns 414 in the spiral interconnect 400. In some examples, there are more than four turns 414 in the spiral interconnect 400. In some examples, there are fewer than four turns 414 in the spiral interconnect 400. The number of turns in the spiral interconnect 400 can be adjusted to achieve a desired inductance of the spiral interconnect 400. Shown is a spiral interconnect diameter 416. The spiral interconnect diameter 416 can be adjusted to achieve a desired resistance.

In some examples, the spiral interconnect 400 is an air core inductor. In some examples, the void of the spiral interconnect 400 is filled with plastic, ceramic, epoxy, or other non-ferromagnetic material. In some examples, the spiral interconnect 400 is a ferromagnetic inductor. In some examples, the spiral interconnect is composed of copper, aluminum, or other conductive metal. In some examples, the spiral interconnect 400 is coated in plastic, ceramic, epoxy, or other non-conductive material.

The characteristics of the spiral interconnect 400 including the coil diameter, the end diameter 412, the number of turns 414, the spiral interconnect diameter 416, the spiral interconnect material, the void size, the material composition, and the material filling the void, can all be chosen or adjusted to achieve a desired inductance and quality factor. This allows the spiral interconnect 400 to be chosen or adjusted based upon the needs and constraints of the semiconductor device the spiral interconnect 400 is a part of.

In some examples, the characteristics of each spiral interconnect of a semiconductor device are chosen based upon the needs of the connection the spiral interconnect is used for. In some examples, at least some of the spiral interconnects have the same characteristics. In some examples, at least some of the spiral interconnects have different characteristics.

Figure 5:
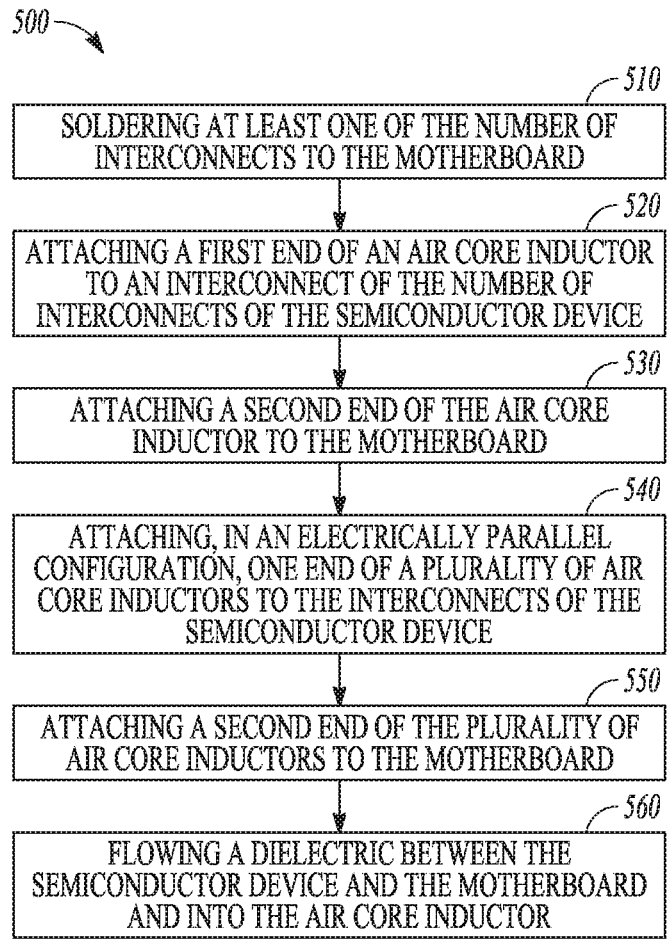
FIG. 5 is a process diagram of a method in accordance with some embodiments of the invention.

FIG. 5 shows steps in an example process of attaching an IC die package to a substrate using interconnects that at least partially include air core inductors. In FIG. 5 at least one interconnect from a number of interconnects of the IC package substrate is soldered to the motherboard 510. In an example, the air core inductor is attached to the semiconductor device 520 and the motherboard 530 using a conductive adhesive. In an example, the conductive adhesive is epoxy. In an example, the air core inductor is attached to the semiconductor device 520 and the motherboard 530 using solder.

In an example, one end of a plurality of air core inductors are attached to the semiconductor device in parallel 540. A second end of the plurality of air core inductors is attached to the motherboard 550. In an example, a dielectric is flowed between the semiconductor device and the motherboard such that the air core inductor is filled and encapsulated by the dielectric 560. In an example, the dielectric may include suspended particles. In some examples, the suspended particles are metallic. In some examples, the suspended particles are magnetic. In some examples, the dielectric includes magnetic material, thereby enhancing the inductance of the air core inductors. It should be appreciated that filling an air core inductor with a dielectric, after the air core inductor is attached to a semiconductor device and a motherboard, does not change its designation as an air core inductor.

Figure 6:
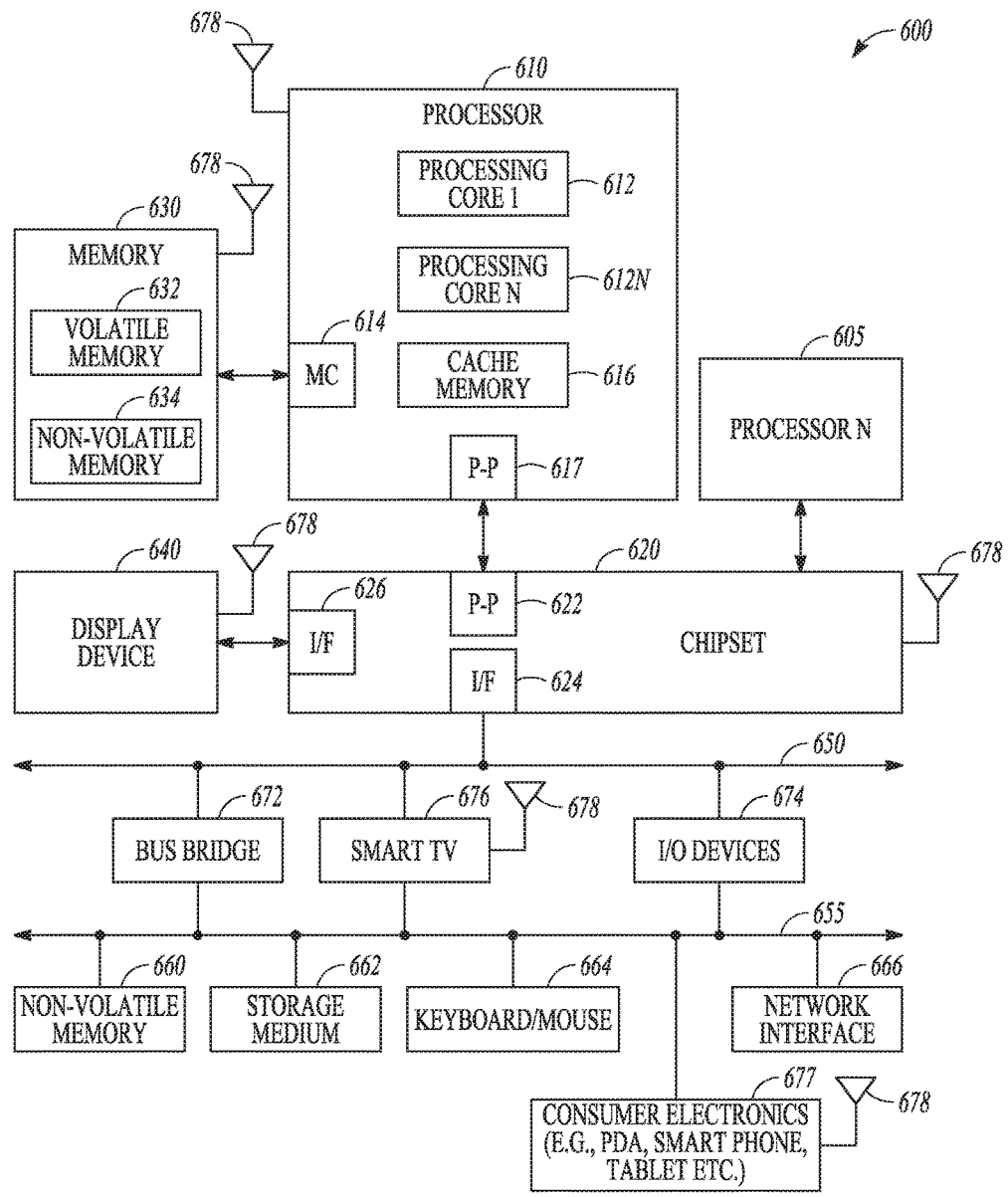
FIG. 6 is block diagram of an electronic system in accordance with some embodiments of the invention.

FIG. 6 illustrates a system level diagram, according to one embodiment of the invention. For instance, FIG. 6 depicts an example of an electronic device (e.g., system) including the IC package utilizing spiral interconnects as described in the present disclosure. FIG. 6 is included to show an example of a higher level device application for the present invention. In one embodiment, system 600 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 600 is a system on a chip (SOC) system.

In one embodiment, processor 610 has one or more processing cores 612 and 612N, where 612N represents the Nth processor core inside processor 610 where N is a positive integer. In one embodiment, system 600 includes multiple processors including 610 and 605, where processor 605 has logic similar or identical to the logic of processor 610. In some embodiments, processing core 612 includes, but is not limited to, pre-fetch logic to fetch instructions, decode logic to decode the instructions, execution logic to execute instructions and the like. In some embodiments, processor 610 has a cache memory 616 to cache instructions and/or data for system 600. Cache memory 616 may be organized into a hierarchal structure including one or more levels of cache memory.

In some embodiments, processor 610 includes a memory controller 614, which is operable to perform functions that enable the processor 610 to access and communicate with memory 630 that includes a volatile memory 632 and/or a non-volatile memory 634. In some embodiments, processor 610 is coupled with memory 630 and chipset 620. Processor 610 may also be coupled to a wireless antenna 678 to communicate with any device configured to transmit and/or receive wireless signals. In one embodiment, the wireless antenna interface 678 operates in accordance with, but is not limited to, the IEEE 602.11 standard and its related family, Home Plug AV (HPAV), Ultra Wide Band (UWB), Bluetooth, WiMax, or any form of wireless communication protocol.

In some embodiments, volatile memory 632 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 634 includes, but is not limited to, flash memory, phase change memory (PCM), read-only memory (ROM), electrically erasable programmable read-only memory (EEPROM), or any other type of non-volatile memory device.

Memory 630 stores information and instructions to be executed by processor 610. In one embodiment, memory 630 may also store temporary variables or other intermediate information while processor 610 is executing instructions. In the illustrated embodiment, chipset 620 connects with processor 610 via Point-to-Point (PtP or P-P) interfaces 617 and

622. Chipset 620 enables processor 610 to connect to other elements in system 600. In some embodiments of the invention, interfaces 617 and 622 operate in accordance with a PtP communication protocol such as the Intel® QuickPath Interconnect (QPI) or the like. In other embodiments, a different interconnect may be used.

In some embodiments, chipset 620 is operable to communicate with processor 610, 605N, display device 640, and other devices 672, 676, 674, 660, 662, 664, 666, 677, etc. Chipset 620 may also be coupled to a wireless antenna 678 to communicate with any device configured to transmit and/or receive wireless signals.

Chipset 620 connects to display device 640 via interface 626. Display 640 may be, for example, a liquid crystal display (LCD), a plasma display, cathode ray tube (CRT) display, or any other form of visual display device. In some embodiments of the invention, processor 610 and chipset 620 are merged into a single SOC. In addition, chipset 620 connects to one or more buses 650 and 655 that interconnect various elements 674, 660, 662, 664, and 666. Buses 650 and 655 may be interconnected together via a bus bridge 672. In one embodiment, chipset 620, via interface 624, couples with a non-volatile memory 660, a mass storage device(s) 662, a keyboard/mouse 664, a network interface 666, smart TV 676, consumer electronics 677, etc.

In one embodiment, mass storage device 662 includes, but is not limited to, a solid state drive, a hard disk drive, a universal serial bus flash memory drive, or any other form of computer data storage medium. In one embodiment, network interface 666 is implemented by any type of well known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 602.11 standard and its related family, Home Plug AV (HPAV), Ultra Wide Band (UWB), Bluetooth, WiMax, or any form of wireless communication protocol.

While the modules shown in FIG. 6 are depicted as separate blocks within the system 600, the functions performed by some of these blocks may be integrated within a single semiconductor circuit or may be implemented using two or more separate integrated circuits. For example, although cache memory 616 is depicted as a separate block within processor 610, cache memory 616 (or selected aspects of 616) can be incorporated into processor core 612.

To better illustrate the method and apparatuses disclosed herein, a non-limiting list of embodiments is provided here:

Example 1 is a semiconductor device, comprising: a semiconductor die; a substrate attached to the semiconductor die; and a spiral interconnect bridging the space between the substrate and the motherboard.

In Example 2, the subject matter of Example 1 optionally includes wherein the spiral interconnect is an air core inductor.

In Example 3, the subject matter of any one or more of Examples 1-2 optionally include a number of interconnects bridging the space between the substrate and the motherboard; a plurality of spiral interconnects bridging the space between the substrate and the motherboard, the plurality of spiral interconnects located adjacent to the number of interconnects; and wherein the spiral interconnect is one of the plurality of spiral interconnects.

In Example 4, the subject matter of Example 3 optionally includes wherein the plurality of spiral interconnects are air core inductors.

In Example 5, the subject matter of any one or more of Examples 3-4 optionally include wherein a subset of the plurality of spiral interconnects are connected in an electrically parallel configuration.

In Example 6, the subject matter of any one or more of Examples 1-5 optionally include wherein the spiral interconnect is located in a shadow of the semiconductor die.

In Example 7, the subject matter of any one or more of Examples 1-6 optionally include a dielectric encapsulating the air core inductor interconnect.

In Example 8, the subject matter of Example 7 optionally includes wherein the dielectric contains magnetic material.

In Example 9, the subject matter of any one or more of Examples 3-8 optionally include wherein the plurality of spiral interconnects are further located in the shadow of the semiconductor die.

In Example 10, the subject matter of any one or more of Examples 1-9 optionally include wherein the substrate includes a ball grid array (BGA).

In Example 11, the subject matter of any one or more of Examples 3-10 optionally include wherein a coil diameter of the spiral interconnect is tapered from a first end and a second end of the spiral interconnect and the coil diameter is smallest halfway between the first end and the second end of the spiral interconnect.

Example 12 is a semiconductor device, comprising: a semiconductor (lie; a substrate attached to the semiconductor die; a number of interconnects bridging a space between the substrate and a motherboard; and an air core inductor interconnect located in the space between the substrate and the motherboard, the air core inductor interconnect located adjacent to the number of interconnects.

In Example 13, the subject matter of Example 12 optionally includes wherein the air core inductor interconnect is further located in the shadow of the semiconductor die.

In Example 14, the subject matter of any one or more of Examples 12-13 optionally include a plurality of air core inductor interconnects.

In Example 1.5, the subject matter of any one or more of Examples 12-14 optionally include wherein the plurality of air core inductor interconnects are further located in the shadow of the semiconductor die.

In Example 16, the subject matter of any one or more of Examples 14-15 optionally include wherein a subset of the plurality of air core inductor interconnects are connected in an electrically parallel configuration.

In Example 17, the subject matter of any one or more of Examples 12-16 optionally include a dielectric encapsulating the air core inductor interconnect.

In Example 18, the subject matter of Example 17 optionally includes wherein the dielectric contains magnetic material.

In Example 19, the subject matter of any one or more of Examples 14-18 optionally include wherein the plurality of air core inductor interconnects are further located in the shadow of the semiconductor die.

In Example 20, the subject matter of any one or more of Examples 12-19 optionally include wherein the substrate includes a ball grid array (BGA).

Example 21 is a method for attaching a semiconductor device to a motherboard comprising: attaching a number of interconnects of the semiconductor device to the motherboard including: soldering at least one of the number of interconnects to the motherboard; attaching a first end of an air core inductor to an interconnect of the number of interconnects of the semiconductor device; and attaching a second end of the air core inductor to the motherboard.

In Example 22, the subject matter of Example 21 optionally includes wherein the air core inductor is attached to the substrate using a conductive adhesive.

In Example 23, the subject matter of any one or more of Examples 21-22 optionally include wherein the air core inductor is attached to the substrate using solder.

In Example 24, the subject matter of any one or more of Examples 22-23 optionally include flowing a dielectric between the semiconductor device and the motherboard and into the air core inductor.

In Example 25, the subject matter of any one or more of Examples 21-24 optionally include attaching, in an electrically parallel configuration, one end of a plurality of air core inductors to the interconnects of the semiconductor device; and attaching a second end of the plurality of air core inductors to the motherboard.

Example 26 is a semiconductor device, comprising: a semiconductor die; a substrate attached to the semiconductor die; and a spiral interconnect bridging the space between the substrate and the motherboard.

In Example 27, the subject matter of Example 26 optionally includes a number of interconnects bridging the space between the substrate and the motherboard; a plurality of spiral interconnects bridging the space between the substrate and the motherboard, the plurality of spiral interconnects located adjacent to the number of interconnects; and wherein the spiral interconnect is one of the plurality of spiral interconnects.

In Example 28, the subject matter of Example 27 optionally includes wherein a subset of the plurality of spiral interconnects are connected in an electrically parallel configuration.

In Example 29, the subject matter of any one or more of Examples 26-28 optionally include wherein the spiral interconnect is located in a shadow of the semiconductor die.

In Example 30, the subject matter of any one or more of Examples 26-29 optionally include a dielectric encapsulating the air core inductor interconnect.

In Example 31, the subject matter of Example 30 optionally includes wherein the dielectric contains magnetic material.

In Example 32, the subject matter of any one or more of Examples 27-31 optionally include wherein the plurality of spiral interconnects are further located in the shadow of the semiconductor die.

In Example 33, the subject matter of any one or more of Examples 26-32 optionally include wherein the substrate includes a ball grid array (BGA).

In Example 34, the subject matter of any one or more of Examples 29-33 optionally include wherein the spiral interconnect is an air core inductor.

In Example 35, the subject matter of any one or more of Examples 28-34 optionally include wherein the plurality of spiral interconnects are air core inductors.

Example 36 is a semiconductor device, comprising: a semiconductor die; a substrate attached to the semiconductor die; a number of interconnects bridging a space between the substrate and a motherboard; and an air core inductor interconnect located in the space between the substrate and the motherboard, the air core inductor interconnect located adjacent to the number of interconnects.

In Example 37, the subject matter of Example 36 optionally includes wherein the air core inductor interconnect is further located in the shadow of the semiconductor die.

In Example 38, the subject matter of any one or more of Examples 36-37 optionally include a plurality of air core inductor interconnects.

In Example 39, the subject matter of any one or more of Examples 36-38 optionally include wherein the plurality of air core inductor interconnects are further located in the shadow of the semiconductor die.

In Example 40, the subject matter of any one or more of Examples 38-39 optionally include wherein a subset of the plurality of air core inductor interconnects are connected in an electrically parallel configuration.

In Example 41, the subject matter of any one or more of Examples 36-40 optionally include a dielectric encapsulating the air core inductor interconnect.

In Example 42, the subject matter of Example 41 optionally includes wherein the dielectric contains magnetic material.

In Example 43, the subject matter of any one or more of Examples 38-42 optionally include wherein the plurality of air core inductor interconnects are further located in the shadow of the semiconductor die.

In Example 44, the subject matter of any one or more of Examples 36-43 optionally include wherein the substrate includes a ball grid array (BGA).

These and other examples and features of the present interconnects, interconnect systems, and related methods will be set forth in part in the following detailed description. This overview is intended to provide non-limiting examples of the present subject matter—it is not intended to provide an exclusive or exhaustive explanation. The detailed description below is included to provide further information about the present interconnects, interconnect systems, and methods.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. A semiconductor device, comprising:
a semiconductor die;
a substrate attached to the semiconductor die;
a number of interconnects coupled between the substrate and a motherboard, and bridging a space between the substrate and the motherboard;
a plurality of spiral interconnects bridging the space between the substrate and the motherboard, the plurality of spiral interconnects located adjacent to the number of interconnects.

2. The semiconductor device of claim 1, wherein at least one of the plurality of spiral interconnects is an air core inductor.

3. The semiconductor device of claim 1, wherein all of the plurality of spiral interconnects are air core inductors.

4. The semiconductor device of claim 1, wherein a subset of the plurality of spiral interconnects are connected in an electrically parallel configuration.

5. The semiconductor device of claim 1, wherein at least one of the plurality of spiral interconnects is located in a shadow of the semiconductor die.

6. The semiconductor device of claim 1, further comprising:
a dielectric encapsulating at least one of the plurality of spiral interconnects.

7. The semiconductor device of claim 6, wherein the dielectric contains magnetic material.

8. The semiconductor device of claim 1, wherein the plurality of spiral interconnects are all located in a shadow of the semiconductor die.

9. The semiconductor device of claim 1, wherein the substrate includes a ball grid array (BGA).

10. The semiconductor device of claim 1, wherein a coil diameter of at least one of the plurality of spiral interconnects is tapered from a first end and a second end of the spiral interconnect and the coil diameter is smallest halfway between the first end and the second end of the spiral interconnect.

11. A semiconductor device, comprising:
a semiconductor die;
a substrate attached to the semiconductor die;
a number of interconnects bridging a space between the substrate and a motherboard; and
an air core inductor interconnect coupled between, and bridging the space between the substrate and the motherboard, the air core inductor interconnect located adjacent to the number of interconnects.

12. The semiconductor device of claim 11, wherein the air core inductor interconnect is further located in a shadow of the semiconductor die.

13. The semiconductor device of claim 11, further comprising:
a plurality of air core inductor interconnects.

14. The semiconductor device of claim 13, wherein the plurality of air core inductor interconnects are further located in a shadow of the semiconductor die.

15. The semiconductor device of claim 13, wherein a subset of the plurality of air core inductor interconnects are connected in an electrically parallel configuration.

16. The semiconductor device of claim 11, further comprising:
a dielectric encapsulating the air core inductor interconnect.

17. The semiconductor device of claim 11, wherein the substrate includes a ball grid array (BGA).

18. A method for attaching a semiconductor device to a motherboard comprising:
attaching a number of interconnects of the semiconductor device to the motherboard including:
soldering at least one of the number of interconnects to the motherboard;
attaching a first end of an air core inductor to an interconnect of the number of interconnects of the semiconductor device; and
bridging a space between the semiconductor device and the motherboard with the air core inductor, and attaching a second end of the air core inductor to the motherboard.

19. The method of claim 18, wherein the air core inductor is attached to the substrate using a conductive adhesive.

20. The method of claim 18, wherein the air core inductor is attached to the substrate using solder.

21. The method of claim 19, further comprising:
flowing a dielectric between the semiconductor device and the motherboard and into the air core inductor.

22. The method of claim 18, further comprising:
attaching, in an electrically parallel configuration, one end of a plurality of air core inductors to the interconnects of the semiconductor device; and
attaching a second end of the plurality of air core inductors to the motherboard.

* * * * *